United States Patent
Chooi et al.

(10) Patent No.: US 6,465,888 B2
(45) Date of Patent: Oct. 15, 2002

(54) COMPOSITE SILICON-METAL NITRIDE BARRIER TO PREVENT FORMATION OF METAL FLUORIDES IN COPPER DAMASCENE

(75) Inventors: Simon Chooi, Singapore (SG); Subhash Gupta, Singapore (SG); Mei Sheng Zhou, Singapore (SG); Sang Ki Hong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/043,604

(22) Filed: Jan. 14, 2002

(65) Prior Publication Data

US 2002/0064941 A1 May 30, 2002

Related U.S. Application Data

(62) Division of application No. 09/587,467, filed on Jun. 5, 2000, now Pat. No. 6,372,636.

(51) Int. Cl.[7] .............................................. H01L 23/52
(52) U.S. Cl. ...................... 257/751; 257/758; 257/762; 257/763; 257/764; 257/775
(58) Field of Search ................................. 257/751, 752, 257/758, 760, 762, 763, 764, 770, 775

(56) References Cited

U.S. PATENT DOCUMENTS

| | | | |
|---|---|---|---|
| 5,795,823 A | 8/1998 | Avanzino et al. | 438/639 |
| 5,924,008 A | 7/1999 | Michael et al. | 438/647 |
| 5,990,011 A | 11/1999 | McTeer | 438/692 |
| 6,007,733 A | 12/1999 | Jang et al. | 216/80 |
| 6,017,817 A | 1/2000 | Chung et al. | 438/637 |
| 6,326,297 B1 * | 12/2001 | Vijayendran | 438/627 |
| 2001/0003063 A1 * | 6/2001 | Hu et al. | 438/683 |
| 2001/0022398 A1 * | 9/2001 | Grill et al. | 257/758 |

FOREIGN PATENT DOCUMENTS

JP         2-148760 A  *  6/1990   ........... H01L/27/04

* cited by examiner

*Primary Examiner*—Olik Chaudhuri
*Assistant Examiner*—Stephen W. Smoot
(74) *Attorney, Agent, or Firm*—George O. Saile; Rosemary L.S. Pike

(57) ABSTRACT

A method of forming amorphous silicon spacers followed by the forming of metal nitride over the spacers in a copper damascene structure—single, dual, or multi-structure—is disclosed in order to prevent the formation of fluorides in copper. In a first embodiment, the interconnection between the copper damascene and an underlying copper metal layer is made by forming an opening from the dual damascene structure to the underlying copper layer after the formation of the metal nitride layer over the amorphous silicon spacers formed on the inside walls of the dual damascene structure. In the second embodiment, the interconnection between the dual damascene structure and the underlying copper line is made from the dual damascene structure by etching into the underlying copper layer after the forming of the amorphous silicon spacers and before the forming of the metal nitride layer. In the third embodiment, the ternary metal silicon nitride spacer is formed by etching after having first formed the amorphous silicon layer and the nitride layer, in that order, and then etching the passivation/barrier layer at the bottom of the damascene structure into the underlying copper layer. In all three embodiments, metal nitride reacts with amorphous silicon to form a ternary metal silicon nitride having an excellent property of adhering to copper while at the same time for forming an excellent barrier to diffusion of copper.

7 Claims, 8 Drawing Sheets

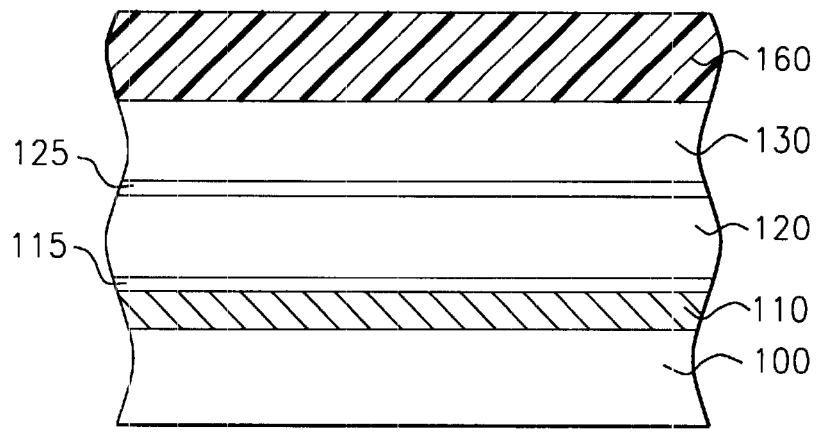
FIG. 1a - Prior Art
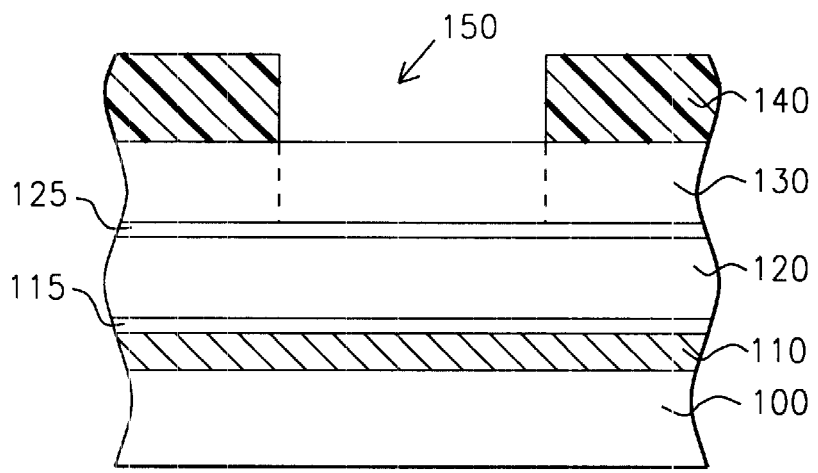
FIG. 1b - Prior Art
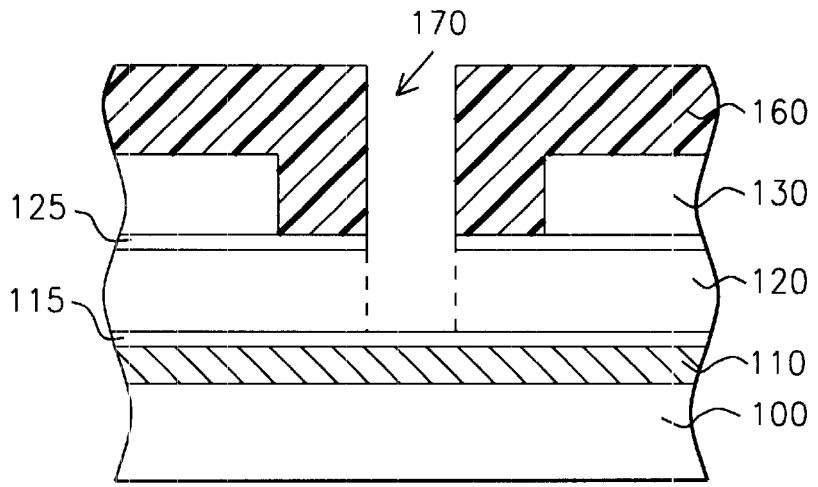
FIG. 1c - Prior Art

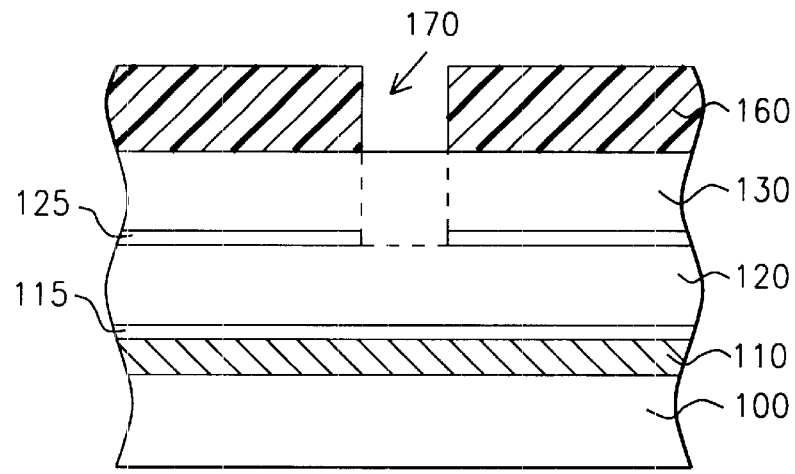
FIG. 1d - Prior Art
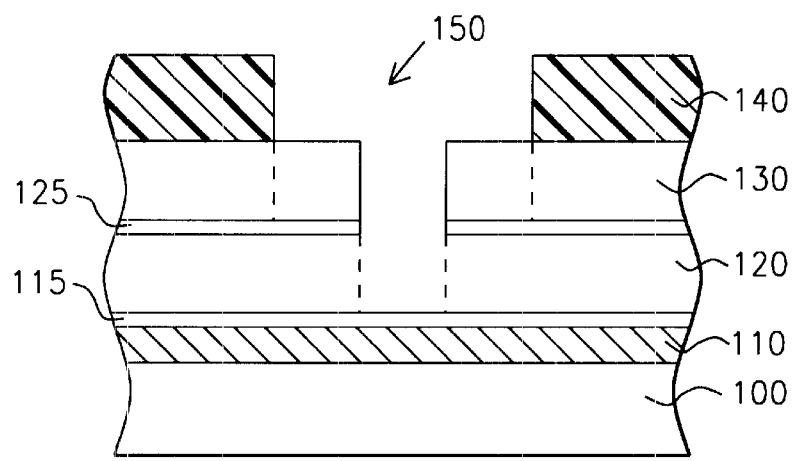
FIG. 1e - Prior Art
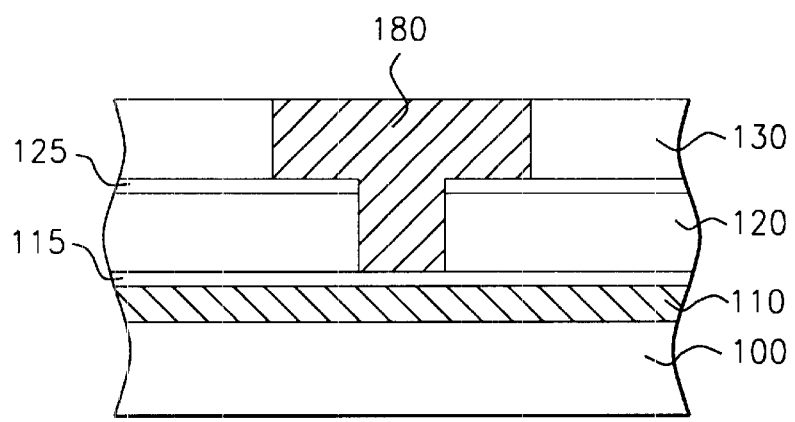
FIG. 1f - Prior Art

COMPOSITE SILICON-METAL NITRIDE BARRIER TO PREVENT FORMATION OF METAL FLUORIDES IN COPPER DAMASCENE

This is a division of patent application Ser. No. 09/587,467, filing date Jun. 5, 2000 now U.S. Pat. No. 6,372,636, Composite Silicon-Metal Nitride Barrier To Prevent Formation Of Metal Flourides In Copper Damascene, assigned to the same assignee as the present invention.

BACKGROUND OF THE INVENTION (1) Field of the Invention

The present invention relates to the manufacture of semiconductor devices in general, and in particular, to a method of using composite silicon-metal nitride as a barrier to prevent formation of metal fluorides in copper damascene interconnects.

(2) Description of the Related Art

Copper is a preferred metal for use as an interconnect in semiconductor devices. This is because, as is well known in the art, copper has lower resistivity than the commonly used aluminum and has better electromigration properties. At the same time, the advent of copper interconnects has motivated the use of insulating materials with low dielectric constant (k) in order to further improve the over-all device performance. Some of the low-k candidates are fluorinated materials, such as amorphous fluorinated carbon ($\alpha$-C:F), PTFE, fluorinated $SiO_2$ and fluorinated polyimide. However, defluoriniation occurs with these materials, which then reacts with barrier materials and causes delamination. Barrier materials are used because, copper unfortunately suffers from high diffusivity in these insulating materials. For instance, copper tends to diffuse into polyimide during high temperature processing of the polyimide. This causes severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required. This invention discloses a method for preventing the fluorine contacting the barrier for the organic low-k and the fluorinated inorganic materials. This is accomplished by forming a thick "trapping" layer of amorphous silicon, followed by metal nitride, as will be described more in detail later in the embodiments of the present invention. The metal nitride then reacts with the silicon to form the ternary metal silicon nitride which has excellent copper diffusion barrier property and adhesion toward copper.

Copper dual damascene process is a well-known technique for forming interconnections in semiconductor devices. It is especially well suited for Ultra Large Scale Integrated (ULSI) circuit technology where more and more devices are being packed into the same or smaller areas in a semiconductor substrate. As the feature sizes get smaller, the smaller geometries result in higher electrical resistances, which in turn degrade circuit performance. As will be described more fully later, damascene process provides a more exact dimensional control over small geometries, while copper, as the metallization material, provides better electrical characteristics.

The term 'damascene' is derived from a form of inlaid metal jewelry first seen in the city of Damascus. In the context of integrated circuits it implies a patterned layer imbedded on and in another layer such that the top surfaces of the two layers are coplanar. Thus, in semiconductor manufacturing, grooves and holes in appropriate locations in the grooves are formed in an insulating material by etching, which are then filled with metal. Metal in grooves form the horizontal metal line interconnects while the metal in the underlying holes form the vertical connections to the layers of metal interconnects formed in the previous damascene structure.

Thus, in a single damascene semiconductor manufacturing process, incisions, or grooves, are formed in an insulating layer and filled with metal to form conductive lines. Dual damascene takes the process one step further in that, in addition to forming the grooves of a single damascene, hole openings are also formed at appropriate places in the groove further into the insulating layer. The resulting composite structure of grooves and holes are filled with metal. The process is repeated as many times as required to form the multi-level interconnections between metal lines and the holes formed therebetween.

In one approach for a dual damascene process shown in FIG. 1a, two insulating layers (120) and (130) are formed on a substrate (100) with an intervening etch-stop layer (125). Substrate (100) is provided with metal layer (110) and a barrier layer or passivation layer (115). Metal layer can be the commonly used aluminum or copper, while the barrier layer can be an oxide layer or nitride layer. A desired trench or groove pattern (150) is first etched into the upper insulating material (130) using conventional photolithographic methods and photoresist (140). The etching stops on etch-stop. layer (125). Next, a second photoresist layer (160) is formed over the substrate, thus filling partially the groove opening (150), and patterned with hole opening (170), as shown in FIG. 1b. The hole pattern is then etched into the lower insulating layer (120) as shown in FIG. 1c and photoresist removed, thus forming the dual damascene structure shown in FIG. 1f.

Or, the order in which the groove and the hole are formed can be reversed. Thus, the upper insulating layer (130) is first etched, or patterned, with hole (170), as shown in FIG. 1d. The hole pattern is also formed into etch-stop layer (125). Then, the upper layer is etched to form groove (150) while at the same time the etching transfers the hole pattern in the etch-stop layer into lower insulation layer (120), as shown in FIG. 1e. It will be noted that the etch-stop layer stops the etching of the groove into the lower insulation layer. After the completion of the thusly formed dual damascene structure, both the hole opening and groove opening are filled with metal (180), and any excess material on the surface of the substrate is removed by chemical mechanical polishing, as seen in FIG. 1f.

Prior art teaches several different methods of forming damascene structures with metal barrier layers. In U.S. Pat. No. 6,017,817, Chung, et al., disclose a method of fabricating a dual damascene structure. A low k dielectric layer and a cap layer are successively formed on a substrate having an active region. A first photoresist layer is formed on the cap layer and the cap layer is then patterned to expose a portion of the low k dielectric layer. The first photoresist layer and a portion of the low k dielectric layer are simultaneously removed to form a wiring line opening. A second photoresist layer is formed on the cap layer to cover a portion of the wiring line opening. When the step of removing the second photoresist layer is performed, a via hole is formed to expose the active region by simultaneously removing the exposed low k dielectric layer. The via hole and the wiring line opening are filled with a metal layer to form a wiring line and a via.

A self-aligned via dual damascene is shown in U.S. Pat. No. 5,795,823 by Avanzino, et al. A mask pattern of trenches of conductive lines containing laterally enlarged areas where the via openings are to formed in the insulating material are first formed. After the conductive line openings with laterally enlarged areas are created, the openings are filled with a conformal material whose etch selectivity is substantially less than the etch selectivity of the insulating material to the enchant for etching the insulating material and whose etch selectivity is substantially greater than the insulating material to its enchant. The conformal material is anisotropically etched to form sidewalls in the enlarged area and remove the material between the sidewalls but leave material remaining in the parts of the conductive lines openings. The sidewalls serve as self aligned mask for etching via openings. The conformal material is either a conductive material which is left in place after the via openings are formed or an insulating material which is removed. In the former, the partially filled conductive line openings are filled with additional conductive material along with the via, which is either the same or different conductive material. In the latter, the conductive line openings and vias are filled with the same conductive material.

In another U.S. Pat. No. 5,990,011 by McTeer, a titanium aluminum alloy wetting layer for improved aluminum filling of damascene trenches is proposed. The novel process forms a first recess, such as a contact hole, within a first dielectric layer upon a semiconductor substrate. At least one diffusion barrier layer, selected from a group consisting of ceramics, metallics, and intermetallics, is formed within the first recess and at least partially conformably formed upon the first dielectric layer. A first electrically conductive layer is then formed within the recess over a said diffusion barrier layer. Preferably, the first electrically conductive layer is substantially composed of tungsten. The first electrically conductive layer is planarized above the recess thereby forming a top surface thereof. A second dielectric layer is formed over the first dielectric layer and said first electrically conductive layer. A second recess is formed in the second dielectric layer. The second recess extends from an upper surface of the second dielectric layer to the top surface of the first electrically conductive layer. The second recess has a bottom formed at least partially by the top surface of the first electrically conductive layer. A wetting layer composed of a titanium-aluminum alloy, is formed within the second recess over the second dielectric layer. A second electrically conductive layer then formed to substantially fill the second recess over the wetting layer. The wetting layer enables the second electrically conductive layer to substantially fill the second recess while being deposited at lower temperatures than conventional deposition processes. A portion of the wetting layer and the electrically conductive layer situated above the upper surface of the second dielectric layer is selectively removed by planarizing to form a planar top surface.

A hard masking method for forming a different oxygen containing plasma etchable layer is taught by Jang, et al., in U.S. Pat. No. 6,007,733. There is first provided a substrate employed within a microelectronics fabrication. There is then formed over the substrate an oxygen containing plasma etchable layer, where the oxygen containing plasma etchable layer is formed of a material which is also susceptible to etching within a fluorine containing plasma. There is then formed upon the oxygen containing plasma etchable layer a hard mask layer. There is then formed upon the hard mask layer a patterned photoresist layer. There is then etched through use of a first anisotropic plasma etch method the hard mask layer to form a patterned hard mask layer while simultaneously reaching the oxygen containing plasma etchable layer and while employing the patterned photoresist layer as a first etch mask layer. The first anisotropic plasma etch method employs an etchant gas composition appropriate for etching the hard mask material. There is then stripped from the patterned hard mask layer the patterned photoresist layer, where the patterned photoresist layer is stripped employing a stripping method which does not attack the oxygen containing plasma etchable layer. Finally, there is then etched through use of a second plasma etch method the oxygen containing plasma etchable layer to form a patterned oxygen containing plasma etchable layer while employing the patterned hard mask layer as a second etch mask layer, where the second plasma etch method is the fluorine containing plasma. etch method. The method is claimed to be particularly useful for forming patterned low dielectric constant dielectric layers within microelectronics fabrications.

In still another U.S. Pat. No. 5,924,008, Michael, et al., show an integrated circuit having local interconnect for reducing signal cross coupled noise. Here, an integrated circuit is provided having an improved interconnect structure. The interconnect structure includes a power-coupled local interconnect which is always retained at VDD or VSS (i.e., ground) level. The local interconnect resides a dielectric-spaced distance below critical runs of overlying interconnect. The powered local interconnect serves to sink noise transients from the critical conductors to ensure that circuits connected to the conductors do not inoperably function. Accordingly, the local interconnect extends along a substantial portion of the conductor length, and is either wider or narrower than the conductor under which it extends. The local interconnect can either be polysilicon, doped polysilicon, polycide, refractory metal silicide, or multi-level refractory metal.

The present invention discloses a novel method of forming ternary metal silicon nitride spacers in a copper damascene structure—single, dual or more—in order to prevent the formation of metal fluorides in copper.

SUMMARY OF THE INVENTION

It is therefore an object of this invention to provide a method of forming a composite silicon-metal nitride barrier to prevent formation of metal fluorides in copper damascene.

It is another object of the present invention to provide a method of forming amorphous silicon spacers followed by the forming of metal nitride over the spacers in a copper damascene structure in order to prevent the formation of metal fluorides in copper.

It is yet another object of the present invention to provide a method of preventing the delamination of layers in a damascene interconnect by forming a ternary metal silicon nitride layer lining the inside walls of the damascene structure.

It is still another object of the present invention to provide a copper damascene structure having inside walls lined with a ternary metal silicon nitride layer in order to prevent the formation of metal fluorides in copper.

These objects are accomplished by providing a substrate having a passivation layer formed over a first metal layer formed on said substrate; forming a damascene structure with substantially vertical inside walls and a substantially flat bottom wall over said passivation layer therein said substrate; forming a layer of amorphous silicon over said inside walls and said bottom wall of said damascene structure; etching said amorphous silicon layer to form silicon spacers on said inside walls, while at the same time removing said amorphous silicon layer from said bottom wall of said damascene structure; forming metal nitride layer over said silicon spacers and over said bottom of said damascene structure; etching said bottom of said damascene structure to expose said first metal layer; depositing second metal over said first metal layer exposed in said damascene structure; and removing excess metal to complete the forming of the damascene of the present invention.

These object are further accomplished by providing a damascene structure with substantially vertical inside walls and a substantially flat bottom wall formed over said first metal layer therein said substrate; amorphous silicon spacers on said inside walls; a metal nitride layer over said silicon spacers and over said bottom of said damascene structure; and a second metal formed within said damascene structure making intimate contact with said, first metal layer exposed in said damascene structure.

BRIEF DESCRIPTION OF THE DRAWINGS

FIGS. 1a–1c show the forming of a dual damascene structure where a line trench or groove is etched first into an upper second dielectric layer until an etch-stop layer is reached, and then the hole pattern etched into the lower first dielectric layer, according to prior art.

FIGS. 1d–1e show the forming of a dual damascene structure where a hole pattern is etched first into an upper second dielectric layer until an etch-stop layer is reached, and then the line pattern etched into the top layer while at the same time the hole pattern is transferred into the lower first dielectric layer, according to prior art.

FIG. 1f shows a dual damascene structure formed by either one of the methods shown in FIGS. 1a–1c or FIGS. 1d–1e, according to prior art.

DESCRIPTION OF THE PREFERRED EMBODIMENTS

Referring now the drawings, FIGS. 2a–2f, 3a–3f and 4a–4f, there is shown a method of forming amorphous silicon spacers followed by the forming of metal nitride over the spacers in a copper dual damascene structure in order to prevent the formation of fluorides in copper. In a first embodiment, shown in FIGS. 2a–2f, the inner walls of a structure, which, for illustrative purposes is a dual damascene, but can also be a single damascene structure, is lined with a passivation/barrier liner followed by the forming of a nitride layer, which in turn is etched to form the silicon-metal nitride spacer, and where the interconnection between the copper damascene and an underlying copper metal layer is made by forming an opening from the damascene structure to the underlying copper layer after the formation of the metal nitride layer over the amorphous silicon spacers formed on the inside walls of the damascene structure. The inside walls of the structure have sidewalls which are substantially vertical and a bottom, which is substantially flat. In the second embodiment, shown in FIGS. 3a–3f, the interconnection between the dual damascene structure and the underlying copper line is made from the dual damascene structure by etching into the underlying copper layer after the forming of the amorphous silicon spacers and before the forming of the metal nitride layer. In the third embodiment, shown in FIGS. 4a–4f, the ternary metal silicon nitride spacer is formed by etching after having first formed the amorphous silicon layer and the nitride layer, in that order, and then etching the passivation/barrier layer at the bottom of the damascene structure into the underlying copper layer. In all three embodiments, metal nitride reacts with amorphous silicon to form a ternary metal silicon nitride having an excellent property of adhering to copper while at the same time for forming an excellent barrier to diffusion of copper.

Figure 2A:
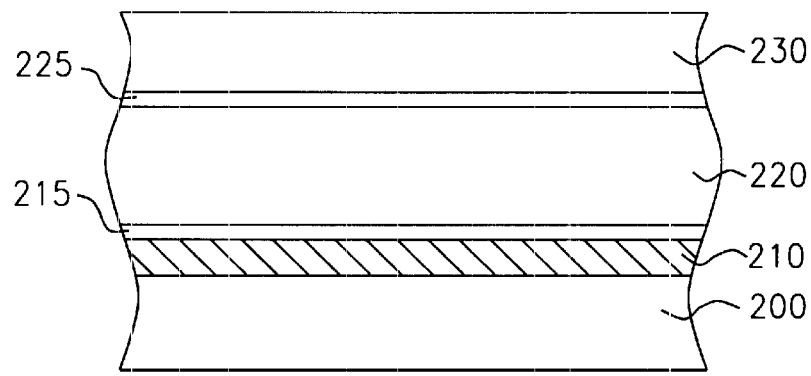
FIG. 2a is a partial cross-sectional view of a substrate having a metal layer and a passivation layer and showing the forming of a first and a second dielectric layer separated from each other by an intervening etch-stop layer, according to the present invention.

Specifically, FIG. 2a shows a portion of a semiconductor substrate (200), preferably silicon, provided with a metal layer (210) and a passivation layer (215). Although not specifically illustrated in FIG. 2a, semiconductor devices such as gate electrodes and source and drain regions, and structures such as metal interconnects, contact plugs and vias and microelectronic layers composed of insulators, dielectrics and conductors, may be formed on or in the semiconductor substrate. Metal can include one or more from a group containing copper, aluminum, aluminum alloy, tungsten, titanium, titanium nitride, tantalum and tantalum nitride, but is preferably copper with a thickness between about 1,000 to 20,000 Å, and the passivation layer includes one or more from a group containing silicon nitride, silicon oxynitride, silicon carbide, boron nitride with a thickness between about 500 to 5,000 Å. First dielectric layer (220) is formed over the passivation layer, comprising a material of low dielectric constant (low-k) and is usually fluorinated, including but not restricted to amorphous fluorocarbon ($\alpha$-C:F), poly-tetra-fluoro-ethylene (PTFE), Teflon, Parylene-F, fluorinated polyimide, fluorinated $SiO_2$ (FSG). First dielectric layer (220) is formed to a thickness between about 1,000 to 10,000 Å by vapor deposition or spin coating followed by an optional furnace or rapid thermal annealing (RTA) treatment.

Figure 2B:
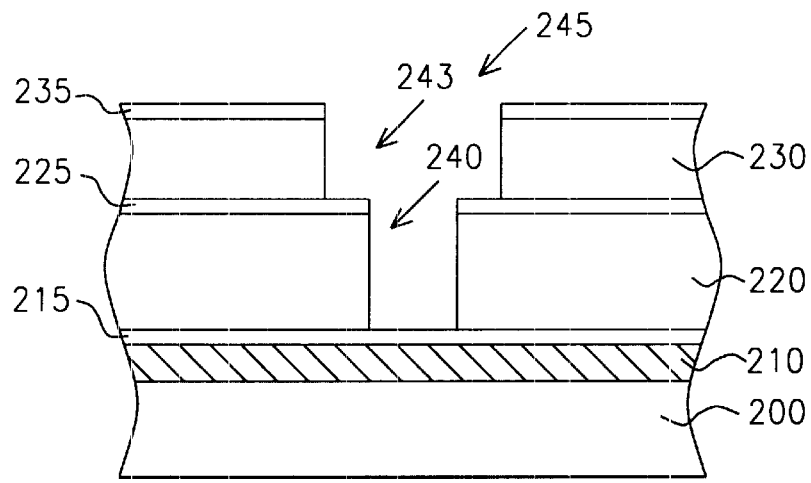
FIG. 2b is a partial cross-sectional view of a substrate showing the forming of a dual damascene structure within the first and second dielectric layers of FIG. 2a, according to the present invention.

Next, an optional first etch-stop layer (225) shown in FIG. 2b is formed over the first dielectric layer. The etch-stop layer is formed by vapor deposition to a thickness between about 50 to 5,000 Å. This is followed by the forming of second dielectric layer (230), which is also a low-k material and is usually fluorinated. It includes amorphous fluorocarbon, poly-tetra-fluoroethlylene (PTFE), Teflon, Parylene-F, fluorinated polyimide, fluorinated $SiO_2$ deposited by vapor deposition or spin coating followed by an optional furnace or RTA treatment to a thickness between about 1,000 to 10,000 Å. Lastly, an optional cap layer (235) is formed by vapor deposition to a thickness between about 50 and 5,000 Å. The cap layer includes one or more of a group containing silicon nitride, silicon oxynitride, silicon carbide and boron nitride.

Using conventional techniques, a first photoresist layer and an optional organic bottom anti-reflective coating (BARC) (not shown) is next formed over the second dielectric layer and then patterned with the image of a conventional via or a contact hole. Using the photoresist layer as a mask, hole pattern (240) is then etched into the optional organic BARC, second and first dielectric layers, in that order, including the intervening optional etch-stop layer (225) as shown in FIG. 2b. The etching of the optional organic layer, dielectric layers and the optional stop-etch layer is accomplished using plasma-assisted dry etching, wherein the etching chemistry includes one or more of the following: fluorocarbon, such as $CF_4$, $C_4F_8$, hydrocarbons, fluorine-substituted hydrocarbons (e.g., $CHF_3$), fluorosulfur, chlorine, hydrogen bromide, oxygen, nitrogen, argon and carbon monoxide. It will be understood by those skilled in the art that different combinations of etching chemistry can be tailored appropriately to the etching of different layers of films.

Figure 2C:
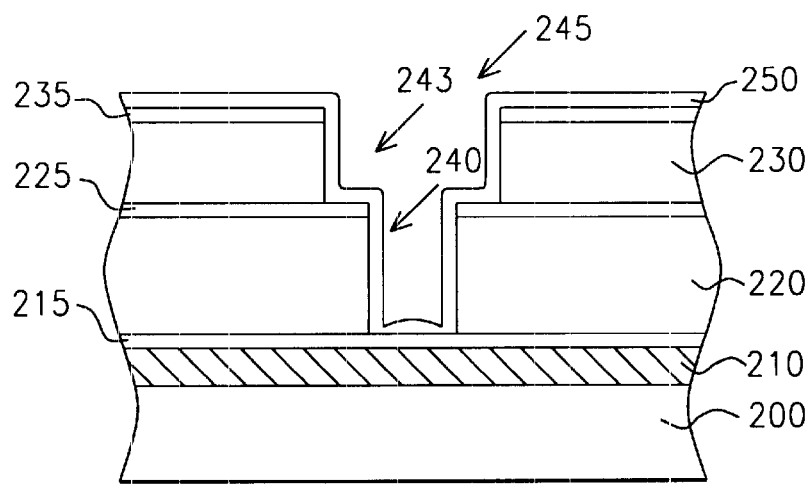
FIG. 2c is a partial cross-sectional view of a substrate showing the forming of an amorphous silicon layer over the inside walls of the dual damascene structure of FIG. 2b, according to the present invention.

Next, the first photoresist layer and BARC are removed, preferably by oxygen plasma ashing, and a second photoresist layer and a second optional organic BARC (not shown) is formed over the substrate, including the opening formed in the previous step, and patterned with the image of a line trench to form groove (243) as shown in the same FIG. 2c. The line pattern is next transferred from the second photoresist layer into the optional second organic BARC and then into the second dielectric layer by plasma-assisted dry etching, wherein the etching chemistry includes one or more of the following: fluorocarbons, hydrocarbons, fluorine, fluorine-assisted hydrocarbons, chlorine, hydrogen, nitrogen, oxygen, argon and carbon monoxide, and first stopping on the optional etch-stop layer (225). In the absence of the optional etch-stop layer, "time-etching" may be employed for a predetermined period of time. After removal of the second photoresist layer and the second optional organic BARC, the same line pattern is then transferred from the second dielectric layer into the etch-stop layer (225). This is accomplished using plasma-assisted dry etching, wherein the etching chemistry includes or more of the following: fluorocarbons, hydrocarbons, fluorine-assisted hydrocarbons, fluorosulfur, nitrogen argon and carbon monoxide. A damascene structure (245), having a composite hole (240) and line (243) pattern is thus formed as shown in FIG. 2b with substantially vertical inside walls and a flat bottom wall.

Next, as a main feature and key aspect of the present invention, a layer of amorphous silicon (250) is formed over the inside walls of the dual damascene structure, including the bottom wall, as shown in FIG. 2c. Amorphous silicon is formed by vapor deposition at a temperature between about 400 to 580° C., and to a thickness between about 50 to 5,000 Å. Amorphous silicon, being in intimate contact with the fluorinated dielectric layers (220) and (230), acts as a trap for fluorine ions and reacts to form $SiF_x$. The trapped fluorine, then, cannot cross into the copper that is to be later deposited in the dual damascene and form metal fluorides in the copper. Hence, detrimental effects of metal fluorides, such as delamination at the interfaces of layers is prevented. It should be noted that polycrystalline silicon, formed between about 580 to 650° C., can also be used provided that the films are stable above 500° C. and that there is no aluminum present prior to its deposition.

Figure 2D:
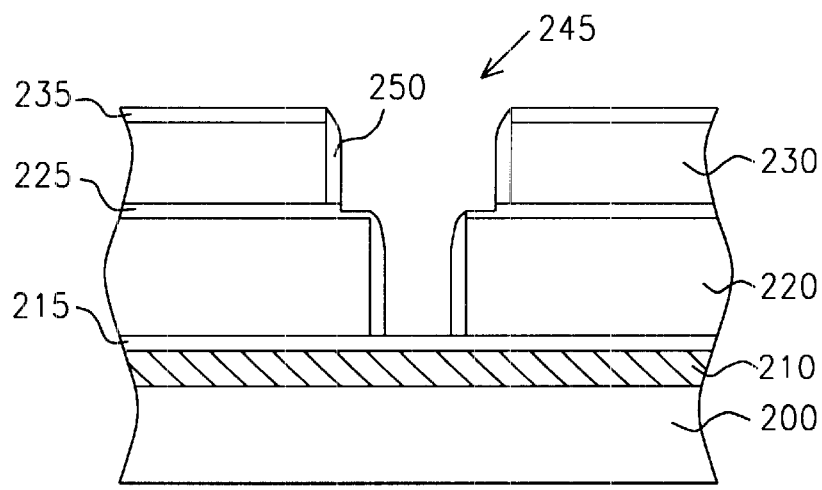
FIG. 2d is a partial cross-sectional view of a substrate showing the forming of silicon spacers, according to the present invention.

Layer (250) is next etched to form silicon spacers as shown in FIG. 2d. The etching is performed using plasma-assisted etching, wherein thy etching chemistry includes one or more of the following: fluorocarbons, hydrocarbons, chlorocarbon, fluorine-substituted hydrocarbons, fluorine, chlorine, nitrogen, oxygen, boron trichloride (BCl3), carbon monoxide and hydrogen bromide. It will also be noted that the etching removes the amorphous silicon from the bottom wall of the dual damascene structure as well. For selective etching of the amorphous silicon over the typical silicon nitride (passivation layer), chlorine as a main etchant is preferred.

Figure 2E:
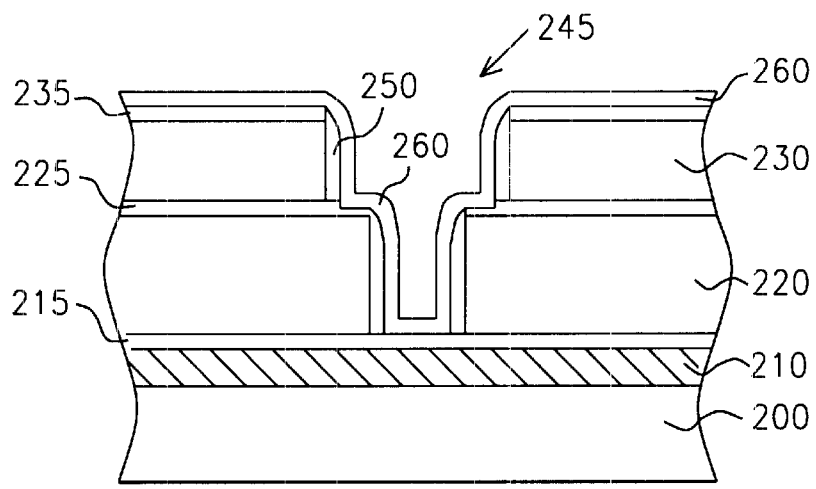
FIG. 2e is a partial cross-sectional view of a substrate showing the forming of a metal nitride layer over the silicon spacers of FIG. 2d, according to the present invention.
Figure 2F:
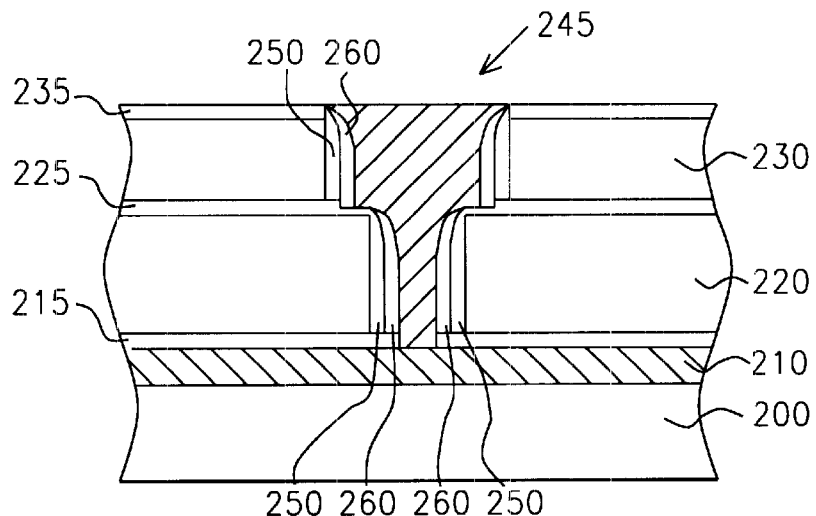
FIG. 2f is a partial cross-sectional view of a substrate showing the forming of an opening from the dual damascene structure of FIG. 2e into the underlying metal layer and then the deposition of copper into the damascene structure of the present invention, according to the first embodiment of the invention.

As another key aspect of the present invention, a layer of metal nitride (260) is formed over the silicon spacers (250)

on the vertical sidewalls of the damascene structure as well as on the bottom wall, as shown in FIG. 2e. Metal nitride includes but not restricted to titanium (TiN), tungsten (WN), tantalum (TaN). TaN is preferred, and formed by vapor deposition or physical vapor deposition (PVD), to a thickness between about 50 to 5,000 Å. Metal nitride (260) then reacts with amorphous silicon (250) during the deposition of metal nitride and/or further heat treatment step, between 200° C. and 800° C. performed between 400 and 760 Torr and in the presence of nitrogen to form the important ternary metal silicon nitride which acts as a barrier to the diffusion of copper to be deposited into the damascene structure shown in FIG. 2f. Prior to the deposition of copper, metal nitride and the passivation layer (215) at the bottom of the dual damascene are etched using etching chemistry including one or more of the following: fluorocarbons, hydrocarbons, fluorine-substituted hydrocarbons, fluorine, chlorine, boron trichloride (BCl3), hydrogen, nitrogen, argon, carbon monoxide until first metal layer (210) is reached. It will be appreciated that the same etching will also remove some parts of the metal silicon nitride from other flat portions of the damascene structure—such as from the ledge between the line and hole openings—thus forming spacer like formations over the amorphous silicon spacers as shown in FIG. 2f. Copper is next deposited through vapor deposition and electroplating to a thickness between about 5,000 angstroms (Å) to 20 micrometers ($\mu$m), and any excess is removed by conventional techniques, such as chemical-mechanical polishing (CMP). Aluminum can also be used in place of copper.

Figure 3A:
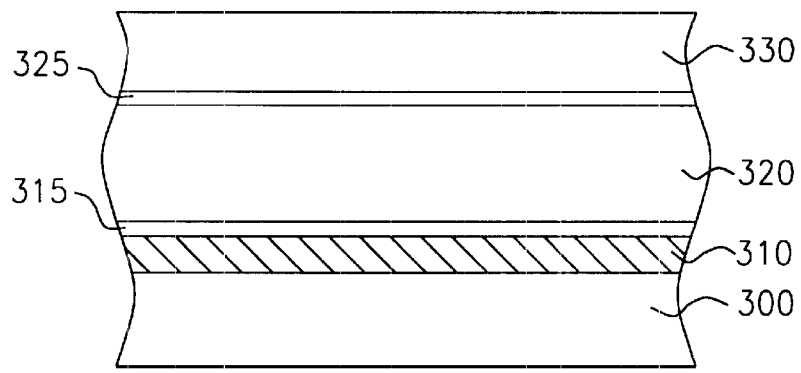
FIG. 3a a partial cross-sectional view of a substrate having a metal layer and a passivation layer and showing the forming of a first and a second dielectric layer separated from each other by an intervening etch-stop layer, according to the present invention.
Figure 3B:
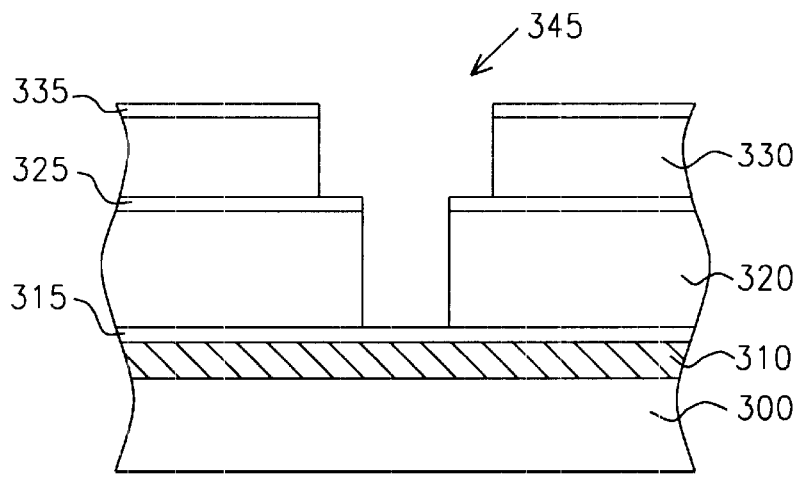
FIG. 3b is a partial cross-sectional view of a substrate showing the forming of a dual damascene structure within the first and second dielectric layers of FIG. 3a, according to the present invention.
Figure 3C:
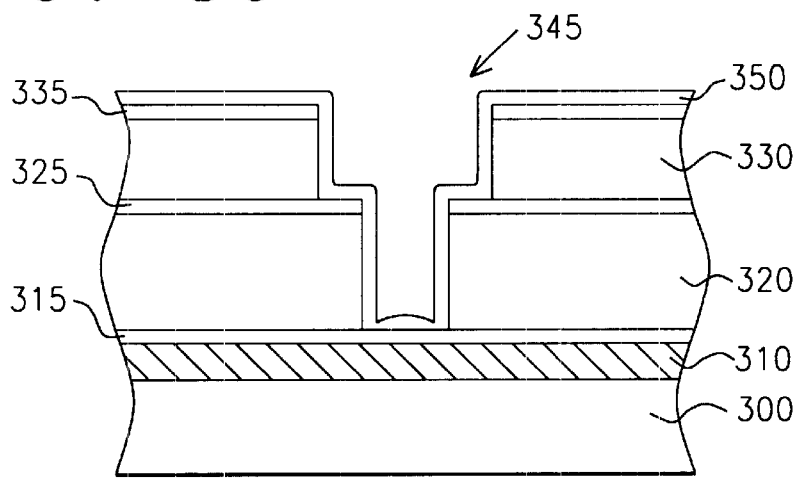
FIG. 3c is a partial cross-sectional view of a substrate showing the forming of an amorphous silicon layer over the inside walls of the dual damascene structure of FIG. 3b, according to the present invention.
Figure 3D:
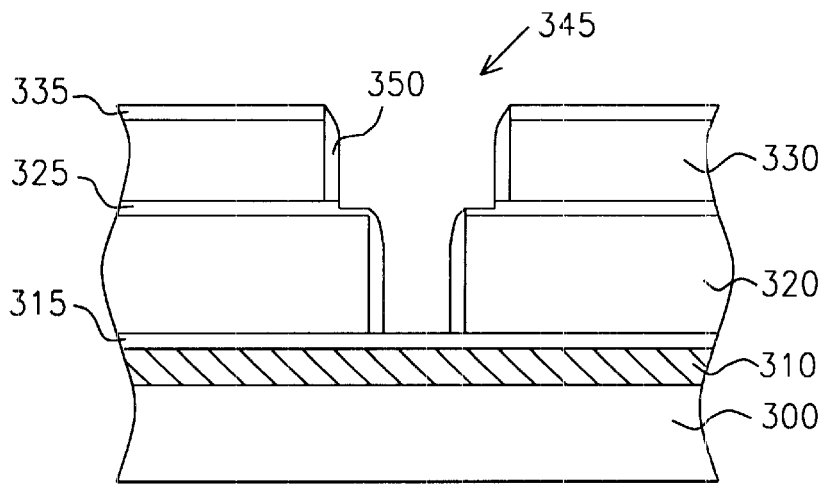
FIG. 3d is a partial cross-sectional view of a substrate showing the forming of silicon spacers, according to the present invention.
Figure 3E:
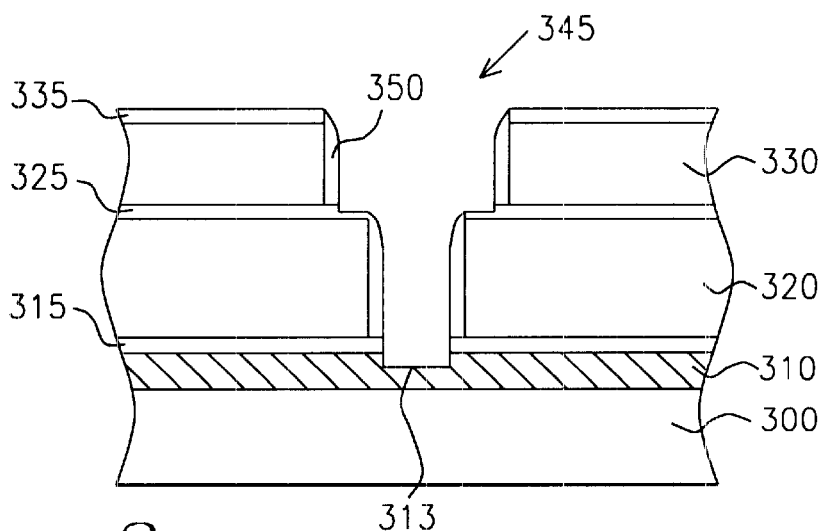
FIG. 3e is a partial cross-sectional view of a substrate showing the forming of an opening from the dual damascene structure of FIG. 3d into the underlying metal layer, according to the present invention.

In a second embodiment shown in FIGS. 3a–3f, damascene structure (345) is formed on substrate (300) having first copper metal layer (310). Passivation layer (315) is formed over the first metal layer and the hole and line patterns of the damascene structure are formed within the optional cap layer (335), the first and second dielectric layers, (320) and (330), respectively, separated by intervening optional etch-stop layer (325). As in the first embodiment, layers (320) and (330) are of low dielectric constant and have same thicknesses as before. Etch-stop layer (325), and passivation layers (315) and cap layer (335) are also the same as in the first embodiment. However, after the forming of amorphous silicon layer (350) shown in FIG. 3c and the forming of silicon spacers (350) shown in FIG. 3d as in the first embodiment, passivation layer (315) is etched to expose the first metal layer (310) as shown in FIG. 3e, before the forming of the metal nitride layer, unlike in the first embodiment. The etching is accomplished using plasma-assisted etching, wherein the etching chemistry includes one or more of the following: fluorocarbons, hydrocarbons, fluorine-substituted hydrocarbons, fluorine, nitrogen, argon and carbon monoxide.

Figure 3F:
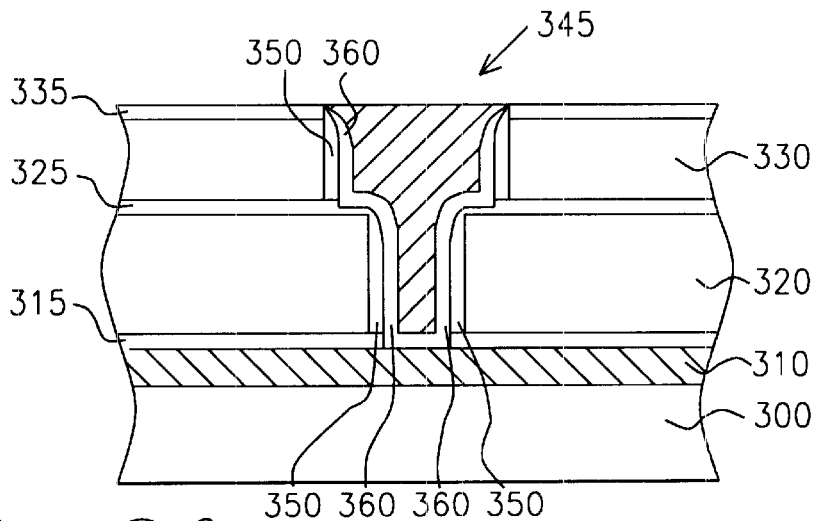
FIG. 3f is a partial cross-sectional view of a substrate showing the forming of a metal nitride layer over the silicon spacers and the exposed first metal layer of FIG. 3e, and then the deposition of copper into the damascene structure of the present invention, according to the second embodiment of the invention.

Then, metal nitride barrier layer (360) is formed over silicon spacers (350) as shown in FIG. 3f. Metal nitride reacts with amorphous silicon to form the ternary metal silicon nitride as in the first embodiment, which has excellent copper diffusion barrier property and adhesion toward copper. Finally, copper is deposited using vapor deposition and electroplating into the composite structure and excess metal removed to complete the forming of the dual damascene interconnect of the present invention.

Figure 4A:
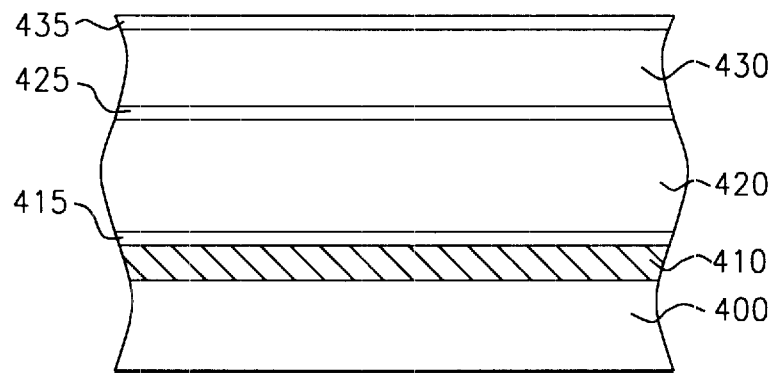
FIG. 4a is a partial cross-sectional view of a substrate having a metal layer and a passivation layer and showing the forming of a first and a second dielectric layer separated from each other by an intervening etch-stop layer, according to the present invention.
Figure 4B:
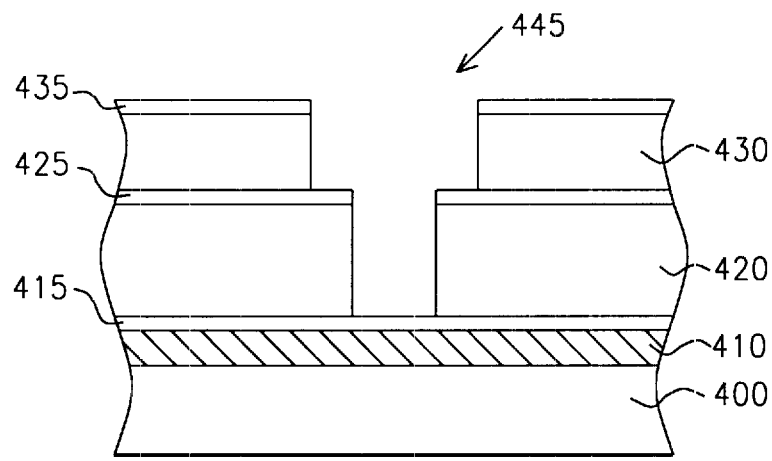
FIG. 4b is a partial cross-sectional view of a substrate showing the forming of a dual damascene structure within the first and second dielectric layers of FIG. 4a, according to the present invention.
Figure 4C:
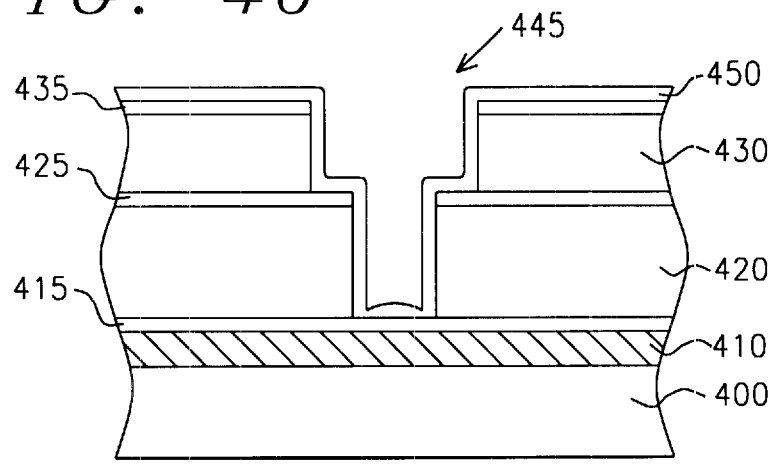
FIG. 4c is a partial cross-sectional view of a substrate showing the forming of an amorphous silicon layer over the inside walls of the dual damascene structure of FIG. 4b, according to the present invention.
Figure 4D:
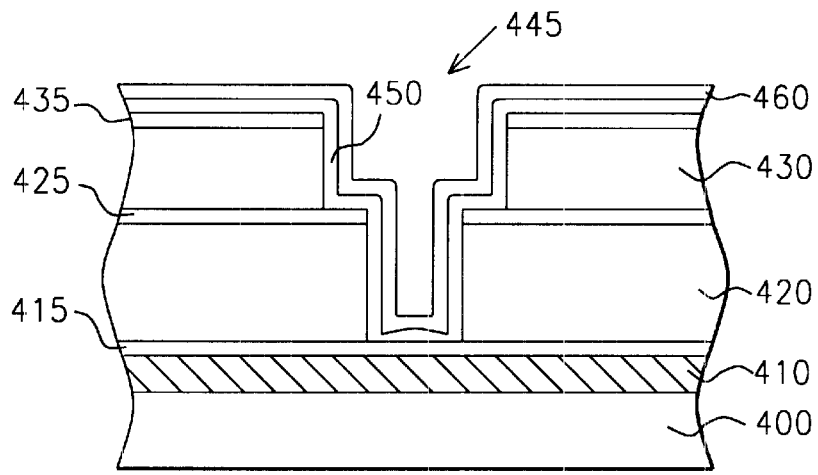
FIG. 4d is a partial cross-sectional view of a substrate showing the forming of a metal nitride layer over the amorphous silicon layer of FIG. 4c, according to the present invention.
Figure 4E:
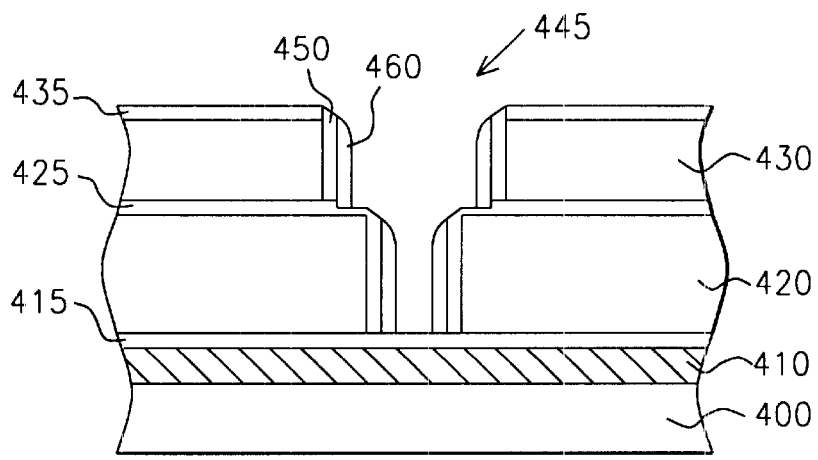
FIG. 4e is a partial cross-sectional view of a substrate showing the forming of the ternary metal silicon nitride silicon spacers of the present invention, while forming an opening from the dual damascene structure of FIG. 4d into the underlying metal layer, according to the third embodiment of the invention.
Figure 4F:
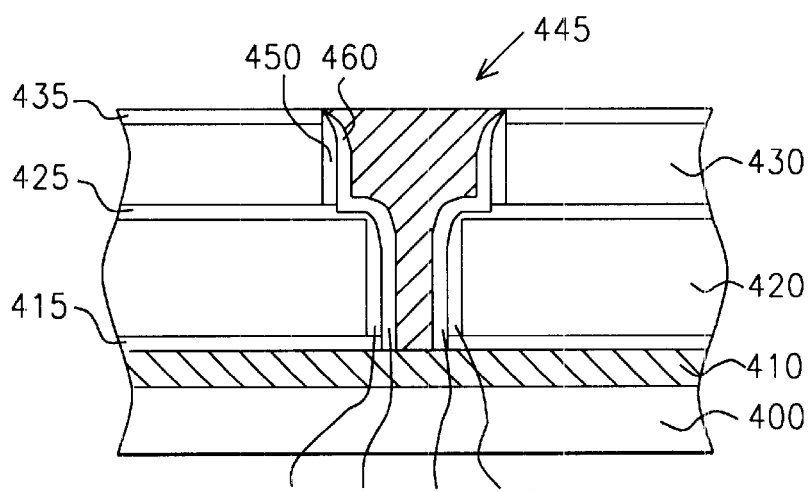
FIG. 4f is a partial cross-sectional view of a substrate showing the deposition of copper into the damascene structure of the present invention, according to the third embodiment of the invention.

In the third embodiment shown in FIGS. 4a–4f, the ternary metal silicon nitride spacer is formed by etching after having first formed the amorphous silicon layer and the nitride layer, in that order, and then etching the passivation/ barrier layer at the bottom of the damascene structure into the underlying copper layer. Thus, damascene structure (445) is formed on substrate (400) having first copper metal layer (410). Passivation layer (415) is formed over the first metal layer and the hole and line patterns of the damascene structure are formed within the optional cap layer (435), the first and second dielectric layers, (420) and (430), respectively, separated by intervening optional etch-stop layer (425). As in the previous embodiments, layers (420) and (430) are of low dielectric constant and have same thicknesses as before. Etch-stop layer (425), passivation layer (415) and cap layer (435) are also the same as in the first embodiment. However, after the forming of amorphous silicon layer (450) shown in FIG. 4c, and unlike in the previous embodiments, the ternary metal spacer is not formed until after the next layer, namely metal nitride layer (460) is first formed as shown in FIG. 4d. Then layers (460) and (450) are etched as shown in FIG. 4e to form the ternary metal silicon nitride spacers through the reaction of nitride with amorphous silicon. The etching is accomplished using plasma-assisted etching, wherein the etching chemistry includes one or more of the following: fluorocarbons, hydrocarbons, fluorine-substituted hydrocarbons, fluorine, boron trichloride , hydrogen, nitrogen, argon and carbon monoxide. The formation of the ternary metal silicon nitride, upon reaction of the metal nitride and amorphous silicon as described in the first embodiment, can be achieved in two ways. First approach follows after the deposition of both metal nitride and amorphous silicon (FIG. 4d) and the second approach is taken after the etching of the metal birdie-amorphous silicon spacers (FIG. 4e).

Finally, copper is deposited using vapor deposition and electroplating into the composite structure and excess metal removed to complete the forming of the dual damascene interconnect of the present invention.

Though these numerous details of the disclosed embodiments are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, applying the same approach to the forming of not only dual or multi-damascene structures, but to single damascene structures as well. Furthermore, the dual damascene structure which is constructed here with the "via-first" approach can also be constructed using the "trench-first" approach, or other known approaches as it will be understood by those skilled in the art.

While the invention has been particularly shown and described with reference to the preferred embodiments thereof, it will be understood by those skilled in the art that various changes in form and details may be made without departing from the spirit and scope of the invention.

What is claimed is:

1. A copper damascene structure having a barrier to prevent formation of metal fluorides in copper comprising:
   providing a semiconductor substrate having a first metal layer formed thereon;
   a damascene structure with substantially vertical inside walls and a substantially flat bottom wall formed over said first metal layer therein said substrate;
   amorphous silicon spacers on said inside walls;
   a metal nitride layer over said silicon spacers and over said bottom of said damascene structure; and
   a second metal formed within said damascene structure making intimate contact with said first metal layer exposed in said damascene structure.

2. The copper damascene of claim 1, wherein said substrate is silicon.

3. The copper damascene of claim 1, wherein said first metal layer includes one or more from a group containing copper, aluminum, aluminum alloy, tungsten, titanium, titanium nitride, tantalum and tantalum nitride.

4. The copper damascene of claim 1, wherein said damascene structure comprises a composite line and hole pattern with said inside walls and said bottom wall.

5. The copper damascene of claim 1, wherein said amorphous silicon spacers have a thickness between about 50 to 5,000 Å.

6. The copper damascene of claim 1, wherein said metal nitride layer has a thickness between about 50 to 5,000 Å.

7. The copper damascene of claim 1, wherein said second metal layer is copper.

* * * * *